US007615817B2

(12) United States Patent  
Moon et al.

(10) Patent No.: US 7,615,817 B2  
(45) Date of Patent: Nov. 10, 2009

(54) METHODS OF MANUFACTURING SEMICONDUCTOR DEVICES AND SEMICONDUCTOR DEVICES MANUFACTURED USING SUCH A METHOD

(75) Inventors: Kwang-jin Moon, Suwon-si (KR); Hyun-su Kim, Suwon-si (KR); Sang-woo Lee, Seoul (KR); Ho-ki Lee, Seongnam-si (KR); Eun-ok Lee, Incheon (KR); Sung-tae Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 11/649,890

(22) Filed: Jan. 5, 2007

(65) Prior Publication Data  
US 2007/0246783 A1 Oct. 25, 2007

(30) Foreign Application Priority Data  
Jan. 5, 2006 (KR) ...................... 10-2006-0001384

(51) Int. Cl.  
*H01L 27/108* (2006.01)

(52) U.S. Cl. ...................................... 257/302; 438/263
(58) Field of Classification Search ................. 257/302, 257/E27.091; 438/263  
See application file for complete search history.

(56) References Cited  
U.S. PATENT DOCUMENTS

| 5,828,094 | A | * | 10/1998 | Lee ............................. 257/296 |
| 5,909,618 | A | * | 6/1999 | Forbes et al. ................. 438/242 |
| 6,218,236 | B1 | | 4/2001 | Economikos et al. |
| 6,777,725 | B2 | | 8/2004 | Willer et al. |
| 7,348,628 | B2 | * | 3/2008 | Yoon et al. ................... 257/328 |

FOREIGN PATENT DOCUMENTS

KR 10-2004-0096339 11/2004

* cited by examiner

Primary Examiner—David Vu  
(74) Attorney, Agent, or Firm—Lee & Morse P.C.

(57) ABSTRACT

A method of manufacturing a semiconductor device includes forming a pillar-shaped active region by etching a portion of a semiconductor substrate, forming a blocking film selectively exposing a sidewall of a lower portion of the pillar-shaped active region, and forming a bit-line selectively on the exposed sidewall of the lower portion of the pillar-shaped active region.

9 Claims, 5 Drawing Sheets

METHODS OF MANUFACTURING SEMICONDUCTOR DEVICES AND SEMICONDUCTOR DEVICES MANUFACTURED USING SUCH A METHOD

BACKGROUND OF THE INVENTION

1. Field of the Invention

The present invention relates to methods of manufacturing a semiconductor device and semiconductor devices manufactured using such a method. More particularly, the invention relates to method of manufacturing a semiconductor device according to design rules having smaller dimensions, and a semiconductor device manufactured using such a method.

2. Description of the Related Art

A semiconductor device generally has transistors, bit-lines, and capacitors formed within an active region of a semiconductor substrate. In general, a gate electrode of each transistor may be formed in the form of a word-line, and the bit-lines and capacitors may be formed at an upper portion of the transistor and may be connected with drain regions and source regions of the transistors, respectively.

Design rules are trending towards smaller dimensions as semiconductors are becoming highly integrated, smaller and thinner. However, conventional semiconductor devices are limited in their ability to be fabricated according to design rules having smaller dimensions (hereinafter called "reduced design rules") as such conventional semiconductor devices fabricated according to the reduced design rules may not be structurally and/or functionally stable. For example, the reduced design rules may result in a problem associated with, e.g., electrical insulation between cells due to a short circuit that may occur in a bit-line bridge, gate electrode, bit-line, etc.

SUMMARY OF THE INVENTION

The present invention is therefore directed to methods of manufacturing a semiconductor device, and semiconductor devices manufactured according to such a method, which substantially overcome one or more of the problems due to limitations and disadvantages of the related art.

It is therefore a feature of an embodiment of the invention to provide a method of manufacturing a semiconductor device having improved electrical insulation between cells despite using reduced design rules.

It is therefore a feature of an embodiment of the invention to provide semiconductor devices manufactured using such a method of manufacturing a semiconductor device having improved electrical insulation between cells despite using reduced design rules.

At least one of the above and other features and advantages of the present invention may be realized by providing a method of manufacturing a semiconductor device, the method including forming a pillar-shaped active region by etching a portion of a semiconductor substrate, forming a blocking film to selectively expose a sidewall of a lower portion of the pillar-shaped active region, and forming a bit-line selectively on the exposed sidewall of the lower portion of the pillar-shaped active region.

Forming the pillar-shaped active region may include forming an upper trench portion in the semiconductor substrate, forming a spacer on sidewalls of the upper trench portion, and forming a lower trench portion disposed below the upper trench portion in the semiconductor substrate.

The upper trench portion may be formed to have a narrower width than the lower trench portion. Forming the upper trench portion and the lower trench portion may include etching predetermined portions of the semiconductor substrate. Forming the pillar-shaped active region may include forming a trench having sidewalls in the semiconductor substrate, and forming a spacer on the semiconductor substrate adjacent to the sidewalls of the trench. A recessed portion may be formed in the sidewalls of the trench before forming the spacer.

Forming the pillar-shaped active region may include anisotropically etching the semiconductor substrate using a spacer formed on pillar-shaped active region as an etching mask to form an upper portion of a trench, forming an etching prevention film on a sidewall of the anisotropically etched region of the semiconductor substrate, and isotropically etching the semiconductor substrate using the etching prevention film and the spacer to form a lower portion of the trench, wherein the lower portion of the trench has a rounded surface.

The method may include forming a transistor in the pillar-shaped active region before or after forming the bit-line. The method may further include forming one of a combination of source and drain regions within the pillar-shaped active region by implanting impurities and a combination of a gate insulating film and a gate electrode on the pillar-shaped active region before forming the bit-line, and forming the other of the combination of source and drain regions and the combination of the gate insulating film and the gate electrode on source and drain regions after forming the bit-line.

Forming the bit-line may include forming a metal film covering the exposed sidewall of the lower end of the pillar-shaped active region and the blocking film, selectively forming a silicide film on the exposed sidewall of the lower end of the pillar-shaped active region through a heat treatment, and removing the blocking film and a remaining portion of the metal film.

Forming the bit-line may include selectively forming a silicide film on the exposed sidewall of the lower end of the pillar-shaped active region while forming a metal film covering the exposed region of the pillar-shaped active region and the blocking film, and removing the blocking film and a remaining portion of the metal film.

At least one of the above and other features and advantages of the present invention may be separately realized by providing a semiconductor device including a semiconductor substrate including pillar-shaped active regions formed thereon, a plurality of transistors each having a source region formed at an upper end of the pillar-shaped active region, a drain region formed in the pillar-shaped active region so as to be spaced from the source region, and a gate electrode formed on a gate insulating film formed on a sidewall of the upper end of the pillar-shaped active region between the source region and the drain region, and bit-lines respectively connected with the drain region to be spaced from the gate electrode and selectively formed on a sidewall of a lower end of the pillar-shaped active region.

The lower end of the pillar-shaped active region may include an upper portion and a lower portion, wherein the drain region is formed in the upper portion of the lower end of the pillar-shaped active region and the sidewall where the respective bit-line is formed is in the lower portion of the lower end of the pillar-shaped active region.

The lower portion of the lower end of the pillar-shaped active region may be wider than the upper portion of the lower end of the pillar-shaped active region. The sidewall of the upper end of the pillar-shaped active region on which the gate insulating layer and the gate electrode are formed may include a recessed portion. The sidewall where the respective bit-line is formed in the lower portion of the lower end of the pillar-shaped active region has a rounded shaped.

The gate electrode may include at least one of TiN, TaN, WN and WCN. The gate electrode may be connected with a word-line including a metal. The bit-line may be a suicide film. The suicide film may be a metallic silicide film including at least one of Co, Ni, Mo, Ta, Zr, W, and Ti.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
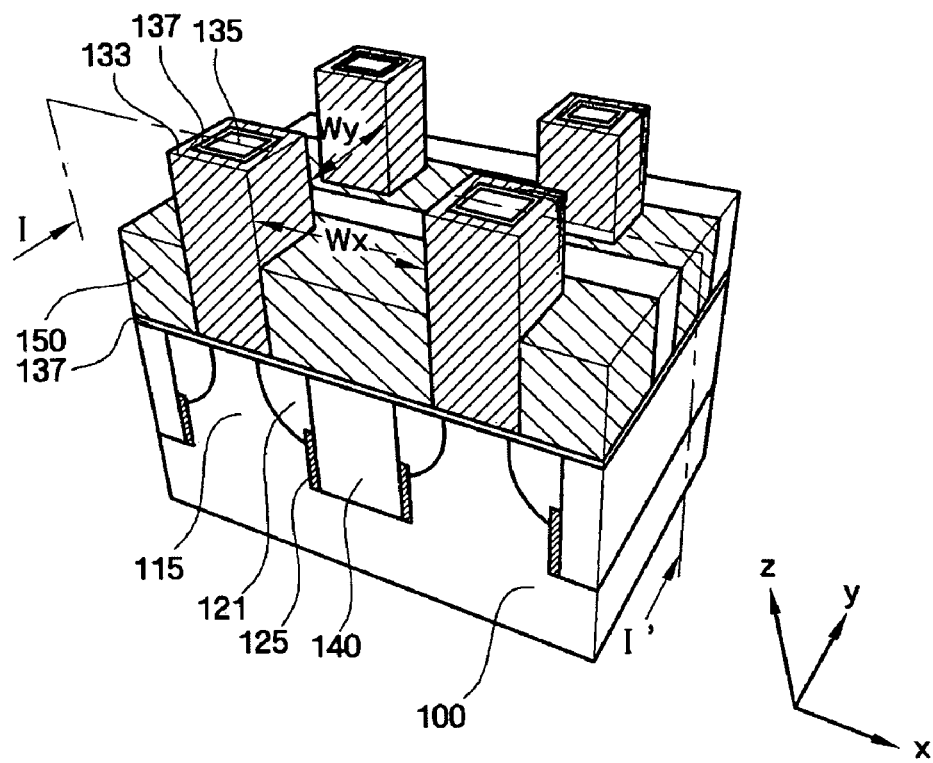
FIG. 1 illustrates a perspective view of a semiconductor device according to a first exemplary embodiment of the invention.

Korean Patent Application No. 10-2006-0001384 filed on Jan. 5, 2006 in the Korean Intellectual Property Office, and entitled: "Method of Manufacturing Semiconductor Device and Semiconductor Device Manufactured Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout the specification.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be through and complete and will fully convey the concept of the invention to those skilled in the art, and the present invention will only be defined by the appended claims.

Exemplary embodiments of the invention will be described below with reference to cross-sectional views, which are exemplary drawings of the invention. The exemplary drawings may be modified by manufacturing techniques and/or tolerances. Accordingly, the exemplary embodiments of the invention are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the invention.

A semiconductor device according to an embodiment of the invention will be described below with reference to FIGS. 1 and 2.

Figure 2:
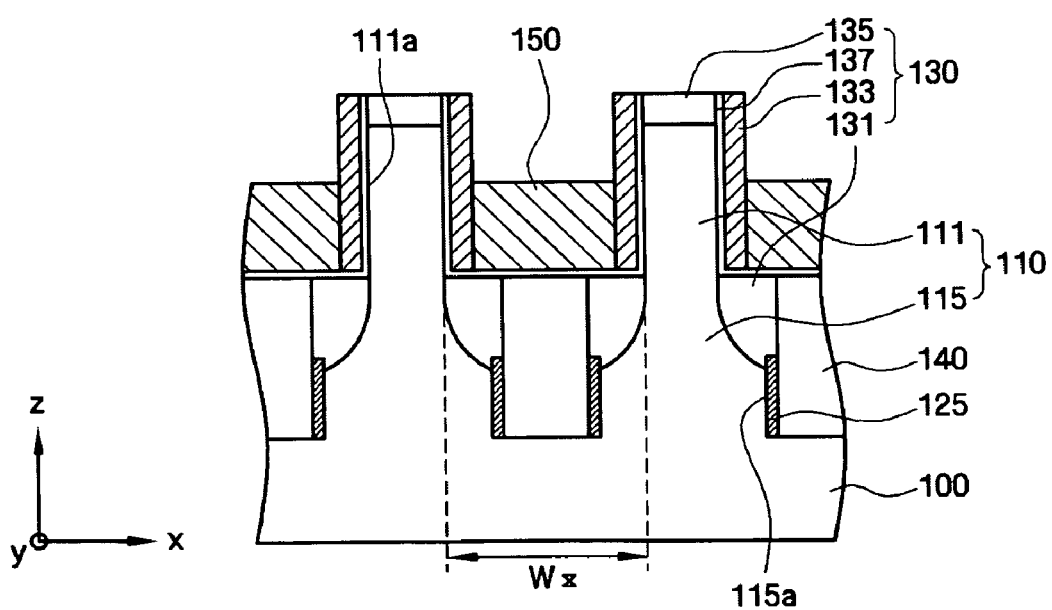
FIG. 2 illustrates a cross-sectional view of the semiconductor device illustrated in FIG. 1, taken along the line I-I' of FIG. 1.

FIG. 1 illustrates a perspective view of a semiconductor device according to a first exemplary embodiment of the invention, and FIG. 2 illustrates a cross-sectional view of the semiconductor device illustrated in FIG. 1, taken along the line I-I' of FIG. 1;

Referring to FIGS. 1 and 2, in some embodiments of the invention, a semiconductor device may include a semiconductor substrate 100 including at least one pillar-shaped active region 110 defined by element isolation regions 140.

The semiconductor substrate 100 may be a substrate containing silicon. For example, the semiconductor substrate 100 may include Si, SiGe, SiC, SiGeC, etc. The pillar-shaped active region 110 may be defined by the element isolation region(s) 140 formed in a recessed region of the semiconductor substrate 100. As shown in FIGS. 1 and 2, the pillar-shaped active region 110 may have a shape of a pillar vertically formed on the semiconductor substrate 100. In FIG. 1, an upper end of the pillar-shaped active region 100 is shown as a rectangle, but embodiments of the invention are not limited to such a shape. That is, the upper end of the pillar-shaped active region 100 may be modified without departing from the scope and spirit of the invention.

The pillar-shaped active region 110 may include a transistor 130. The transistor 130 may include a gate electrode 133, a drain region 131, and a source region 135. As shown in FIGS. 1 and 2, the pillar-shaped active region 110 may be divided into an upper active region 111 and a lower active region 115. The lower active region 115 may be wider than the upper active region 111. The source region 135 may be formed at the upper end of the upper active region 111, and the drain region 131 may be formed in the lower active region 115.

The gate electrode 133 may be formed on a sidewall(s) of the upper active region 111, e.g., on a gate film 137 that may be formed on the sidewall(s) 111a of the upper active region 111, and may be disposed between the source region 135 and the drain region 131. The gate electrode 133 may include, e.g., TiN, TaN, WN and/or WCN. The gate electrode 133 may be connected to a word-line 150. The word-line 150 may include a metal, e.g., tungsten.

A bit-line 125 may be connected with the drain region 131, and may be provided on a sidewall 115a of the lower portion of the pillar-shaped active region 110, i.e. the lower active region 115. For example, the bit-line 125 may extend below the drain region 131 within the semiconductor substrate 100. The bit-line 125 may be insulated from other adjacent transistors. More particularly, the bit-line 125 may be insulated from the transistors connected with the above-mentioned word-line 150. The bit-line 125 may be a silicide film, e.g., a silicide film containing a metal such as Co, Ni, Mo, Ta, Zr, W, or Ti. The bit-line 125 may be spaced away from the gate electrode 133 in the semiconductor substrate 100, such that a likelihood of an occurrence of a short circuit between the gate electrode 133 and the bit-line 125 may be reduced and/or prevented.

Meanwhile, as shown in FIG. 1, the semiconductor device according to an embodiment of the invention may be formed such that a width Wx along an x-direction, and a width Wy along a y-direction between adjacent ones of the pillar-shaped active region 110 protruding from the semiconductor substrate 100 may be different from each other. Specifically, referring to FIG. 2, the width Wx along the x-direction, i.e., along the word-line may be larger than the width Wy along the y-direction, e.g., along the bit-line. For example, in some embodiments of the invention, the width Wx may be about 100 nm to about 110 nm, and the width Wy may be about 50 nm or less.

As described above, a semiconductor device employing one or more aspects of the invention may include a pillar-shaped active region and a bit-line that may be insulated from adjacent cells and may be disposed, e.g., below a drain region in a semiconductor substrate. Therefore, it is possible to obtain improved electrical characteristics while employing a set of reduced design rules.

Figure 3:
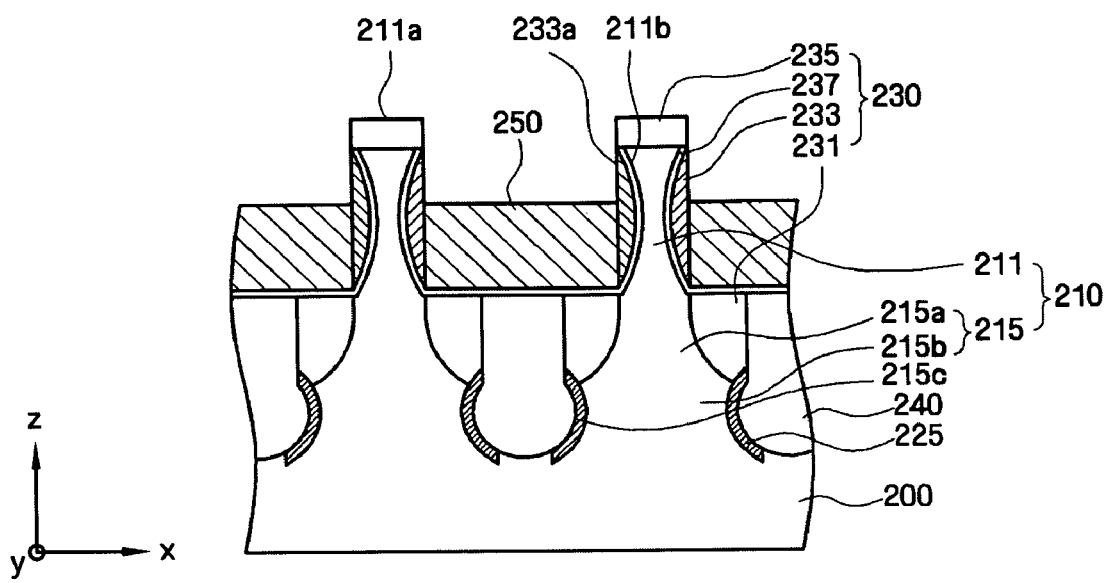
FIG. 3 illustrates a cross-sectional view of a semiconductor device according to a second exemplary embodiment of the invention.

FIG. 3 illustrates a cross-sectional view of a semiconductor device according to a second exemplary embodiment of the invention, and FIGS. 4A to 4G illustrate cross-sectional views sequentially showing resulting structures formed during a method of manufacturing the semiconductor device shown in FIG. 3 according to one or more aspects of the invention. A detailed description of similar elements of exemplary embodiments illustrated in FIGS. 3 and 4, which were described in relation to the exemplary embodiments illustrated in FIGS. 1 and 2 will be omitted.

Referring to FIG. 3, in some embodiments of the invention, a pillar-shaped active region 210 may include an upper active region 211 and a lower active region 215. In embodiments of the invention, the pillar-shaped active region 210 may include a recessed wall(s).

More particularly, e.g., the upper active region 211 may include an upper end 211a and a recessed outer wall 211b. A gate insulating film 237 may be disposed on the recessed outer wall 211b. A gate electrode 233 may partially or completely occupy a space defined by the recessed outer wall 211b. That is, e.g., the gate electrode 233 may fill the recessed outer wall 211b and may include an outerwall 233a. In some embodiments, the gate electrode 233 may fill the recess defined by the recessed outer wall 211b so as to be substantially flush with an upper end portion 211a of the upper active region 211. More particularly, in some embodiments of the invention, the outer wall 233a of the gate electrode 233 may be substantially linear and/or may extend substantially an entire distance along a z-direction that the upper active region 211 protrudes above the semiconductor substrate 100. The z-direction may be substantially perpendicular to both the x-direction and the y-direction. In some embodiments of the invention, the gate electrode 233 may be substantially or completely overlapped, along the z direction, by a source region 235 of the semiconductor device. In some embodiments of the invention, the pillar shaped active region may have a substantially rectangular shape such that at least a portion of sidewalls of the rectangular shaped structure extending along the z direction may be defined by the outer wall 233a of the gate electrode 233.

Further, as shown in FIG. 3, the lower active region 215 of the pillar shaped active region 210 may include an upper end 215a and a lower end 215b. The lower end 215b may have an expanded region that may have, e.g., a curved, rounded, e.g., a spherical or substantially spherical shape. The term "spherical shape" implies that the lower end 215b of the lower active region 215 may be recessed to have a predetermined curvature to expand a space between adjacent cells. As a result, in the lower end 215b, a space between adjacent cells may be larger than a space, which may be occupied by element isolation region 240, between adjacent cells in the upper end 215a. Also, in embodiments of the invention, a width along, e.g., the x-direction, of the lower end 215b of the lower active region 215 may be larger than a width along the x-direction of the upper end 215a of the lower active region 215. As illustrated in FIG. 3, the spherical shape may not be a complete circle.

A bit-line 225 may be disposed on a sidewall of the lower active region 215. In some embodiments of the invention, as illustrated in FIG. 3, the bit-line 225 may be disposed on a sidewall 215c of the lower end 215b of the lower active region 215. The bit-line 225 may be connected with a drain region 231 of the respective transistor, but may be insulated from other adjacent transistors. Further, as described above, since the bit-line 225 may be formed to be spaced apart from the gate electrode 233 and in a semiconductor substrate 200, an occurrence of a short circuit between the gate electrode 233 and the bit-line 225 may be considerably reduced and/or prevented.

As described above, semiconductor devices according to some embodiments of the invention may include a pillar-shaped active region provided with the transistor and a bit-line electrically separating cells in the semiconductor substrate. Therefore, it is possible to obtain improved electrical characteristics while employing a set of reduced design rules.

An exemplary method of manufacturing the semiconductor device shown in FIG. 3 will be described below with reference to FIGS. 4A to 4H. In the following description of a manufacturing method, processes related to processes widely known to those skilled in the art of the invention will be schematically described to avoid any ambiguous definition of the invention. Further, a size, shape, material, or the like of each component described above will either not be described or just briefly described to avoid repetition of the description.

Figure 4A:
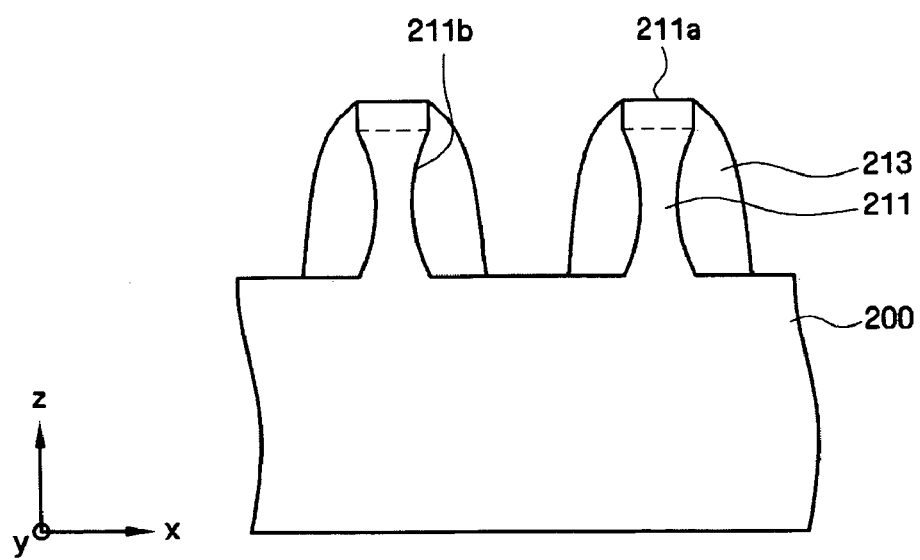
FIGS. 4A to 4G illustrate cross-sectional views sequentially showing resulting structures formed during a method of manufacturing the semiconductor shown in FIG. 3 according to one or more aspects of the invention.

First, as shown in FIG. 4A, the upper active region 211 may be formed by etching a portion of the semiconductor substrate 200. During this process, the sidewall 211b of the upper active region 211 may be formed to be recessed.

Although not shown in drawings, a first etching process of forming the upper active region 211 may include, e.g., the following processes.

First, the semiconductor substrate 200 may be etched at a depth sufficient to form the upper end 211a of the upper active region. A spacer (not shown) may be formed on the sidewall of the etched substrate 200, corresponding to the sidewall of the upper active region 211. The semiconductor substrate 200 may then be further etched at a height, along the z-direction, sufficient to form the upper active region 211 using the spacer as an etching mask. The exposed sidewall of the semiconductor device 200 without the spacer may thereafter be recessed by, e.g., isotropic etching. As a result, the active region 211 having the recessed sidewall(s) 211b, as shown in FIG. 4A can be obtained.

Subsequently, a spacer 213 surrounding the sidewall 211b of the resultant upper active region 211 may be formed.

Next, a second etching may be performed on the semiconductor substrate 200 to form the lower active region 215 under the upper active region 211. The semiconductor substrate 200 after the first etching may be further etched by the second etching using, e.g., the spacer 213 formed on the sidewall 211a of the upper active region 211 as an etching mask.

Figure 4B:
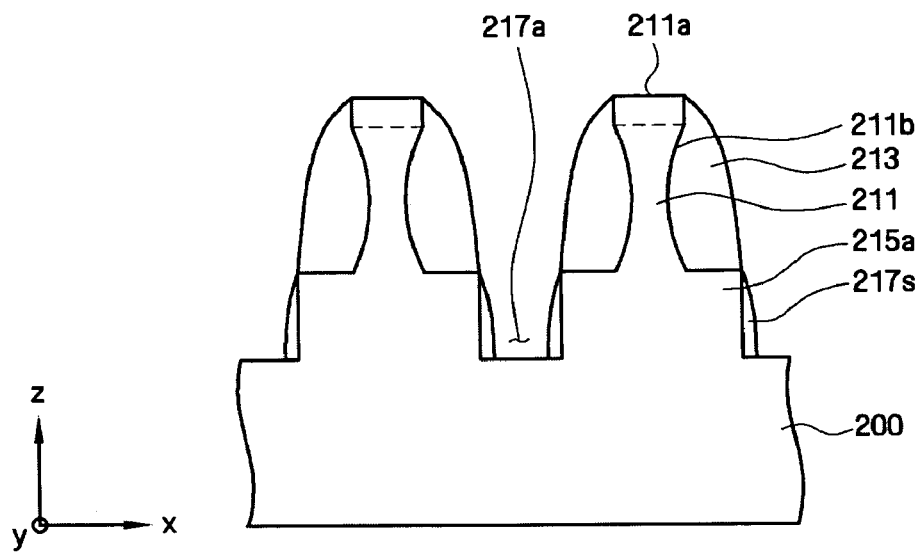
Figure 4C:
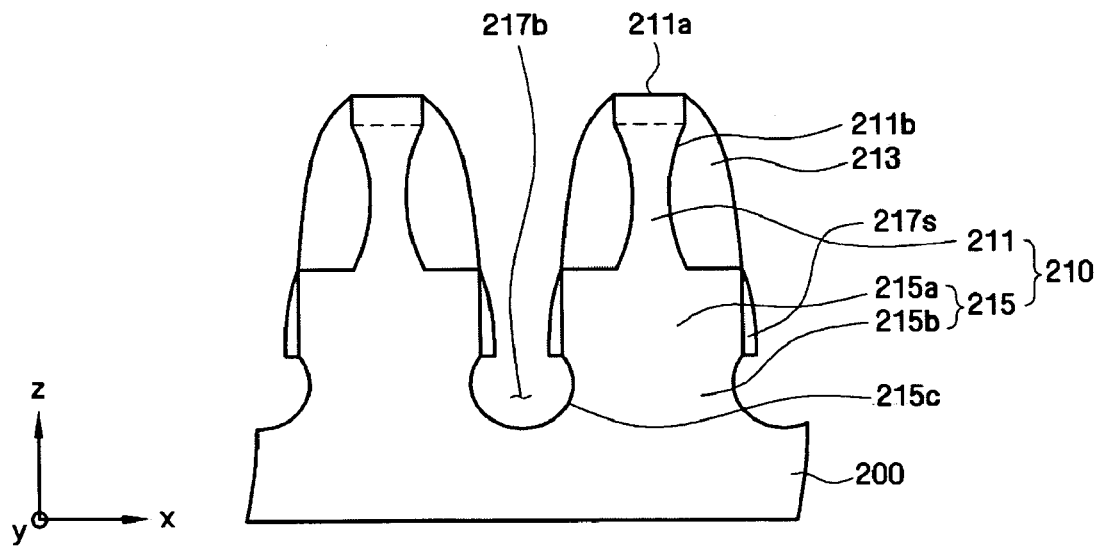

Additional etching for defining the lower active region 215 may be performed by way of several processes, as shown, e.g., in FIGS. 4B and 4C.

First, referring to FIG. 4B, an anisotropic etching may be performed on the semiconductor substrate 200 using, e.g., the spacer 213 on the sidewall 211b of the upper active region 211 as an etching mask. As a result of such etching, an upper trench portion 217a may be formed in the semiconductor substrate 200. The degree of etching, i.e., the etching depth resulting from the aforementioned anisotropic etching may be adjustable in consideration of the depth of the drain region 231 of the transistor.

An etching prevention film 217s may then selectively be formed on a sidewall of the semiconductor substrate 200 previously etched and exposed, e.g., the etching prevention film 217s may not be formed on the previously etched and exposed portions of the semiconductor substrate corresponding to the upper end 211a and/or covered by the spacer 213, and may only be formed on the exposed and etched portion of the semiconductor substrate 200 extending along the z direction.

More particularly, e.g., the etching prevention film 217s may be formed by conformally depositing etching prevention materials on the exposed semiconductor substrate 200 and performing an etch-back thereafter. Accordingly, only a bottom of the etched region of the semiconductor substrate 200 may be exposed. The etching prevention film 217s may be, e.g., a silicon oxide or nitride film, and is not limited as long as it has a different etching selectivity from the semiconductor substrate 200.

Subsequently, as shown in FIG. 4C, the lower active region 215 may be formed by further etching below the upper trench portion 217a. More particularly, in some embodiments, as shown in FIG. 4C, a lower trench region 217b may be formed below the upper trench portion 217a. The lower trench region 217b may have a wider width along the x-direction and/or the y-direction. The lower trench region 217b may be formed by isotropically etching below the previously defined upper trench region 217a shown in FIG. 4B. In this process, the sidewall 215c of the lower end 215b of the lower active region 215 may be formed to have, e.g., the spherical shape, and to be recessed more than the upper end 215a, as shown in FIG. 4C. In some embodiments, the pillar-shaped active region 210 including the upper active region 211 and lower active region 215 may be achieved through these processes.

Figure 4D:
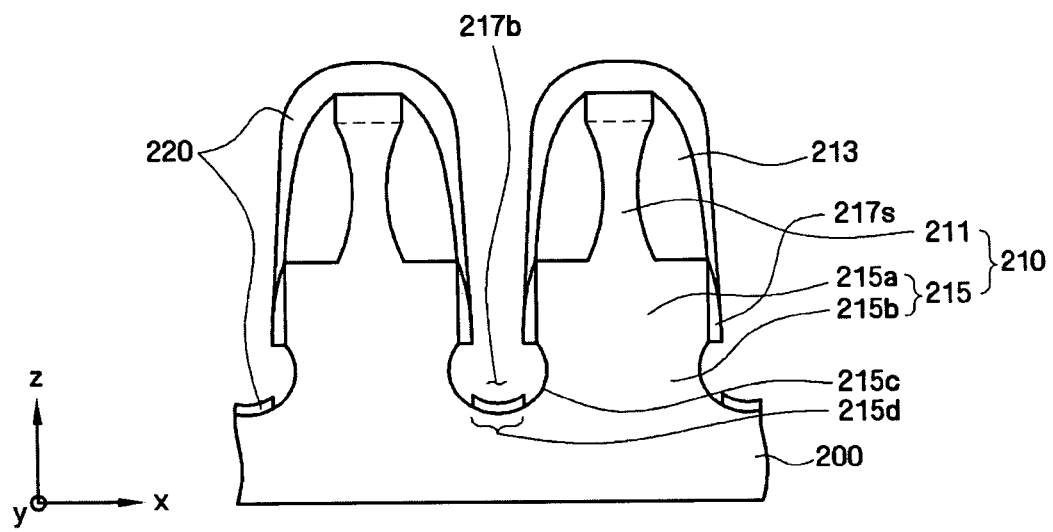

Next, referring to FIG. 4D, a blocking film 220 may be formed. The blocking film 220 may be formed to selectively expose a portion of an upper surface of the semiconductor substrate 200 corresponding to the lower trench portion 217b. In some embodiments, the blocking film 220 may be formed to selectively cover another portion of the upper surface of the semiconductor substrate 200 corresponding to the lower trench region 217b. More particularly, the blocking film 220 may selectively expose, to the outside, at least a portion of the sidewall 215c of the lower portion 215b of the lower active region 215. In some embodiments, e.g., the blocking film 200 may be selectively formed to cover an upper surface of the upper active region 211, and more particularly, an upper surface of the upper end 211a of the upper active region 211, the spacer 213, sidewalls of the upper trench portion 217a that may be covered by the etching prevention film 217s, and a portion of the sidewall(s) 215c. That is, the blocking film 220 may be formed so as to cover a portion of the sidewall 215c of the lower portion 215b of the lower active region 215 and to keep exposed a portion of the sidewall 215c of the lower portion of the lower active region 215. More particularly, in some cases, the blocking layer 220 may selectively cover a portion, e.g., covered portion 215d, of the sidewalls 215c of the lower portion 215b of the lower active region 215 adjacent to the lower trench region 217b, and only expose another portion of the sidewalls 215c.

The blocking film 220 may be formed of, e.g., a material that is capable of preventing silicidation of silicon and metal of the semiconductor substrate 200. More particularly, e.g., the blocking film 220 may be formed using Ionized Physical Vapor Deposition (PVD) that may enable the blocking film 220 to be more precisely and selectively deposited in a vertical direction so as to keep at least a portion of the sidewall 215c of the lower portion 215b of the lower active region 215 exposed. More particularly, the blocking film 220 may be formed so as to keep exposed a portion(s) of the sidewall 215c of the lower portion 215b of the lower active region 215 overlapped by the etching prevention film 217s and/or the upper region 215a of the lower active region and to cover an exposed portion of the sidewall 215c that is not overlapped by another layer or element, e.g., the etching prevention film 217s and/or the upper region 215a of the lower active region 215 along the z-direction. The material forming the blocking film may be TiN, TaN, or WN, but is not limited thereby.

Figure 4E:
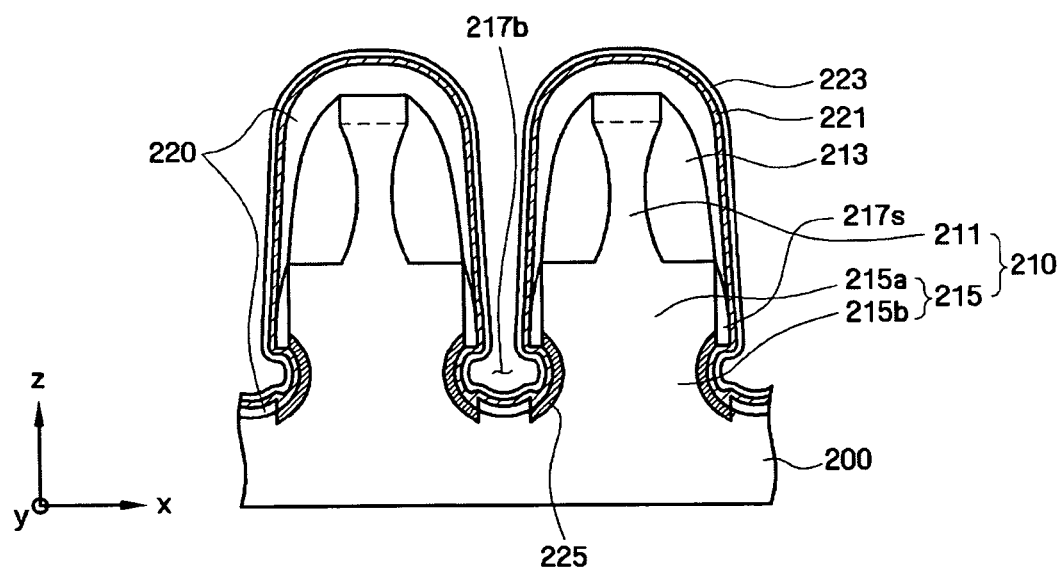

Next, a bit-line 225 may be formed on the sidewall 215c of the lower portion 215b of the pillar-shaped active region 210 as shown in FIG. 4E. More particularly, the bit-line 225 may be formed at a portion of the semiconductor substrate 200 exposed by the blocking layer 220.

The bit-line 225 may be formed using, e.g., a heat treatment after a metal film 221 is conformally formed on a surface of structures shown in FIG. 4D. The metal film 221 may be formed on an entire surface of the structures as shown in FIG. 4E. Through the heat treatment, a silicide film may be formed on a region(s) of the pillar-shaped active region 210, and more particularly, e.g., a region(s) of the sidewalls 215c of the lower portion 215b of the lower active region 215 exposed by the blocking film 220.

As described above, in embodiments of the invention, a silicide film may not be formed on a region(s) where a blocking film is formed; however, the silicide film may be selectively formed on a portion(s) of a lower end of a pillar-shaped active region exposed by the blocking film. Therefore, as shown in FIG. 4E, bit-lines may be separated from adjacent bit-lines in a semiconductor substrate.

In embodiments of the present invention, the metal film 221 may be formed by deposition of, e.g., Co, Ni, Mo, Ta, Zr, W, Ti, etc., at a low temperature, i.e., a temperature where the metal film 221 does not form a silicide layer. The metallic silicide film corresponding to the bit line 225 may be formed through a heat treatment performed at a temperature of about 600° C. to about 850° C. In some embodiments, a capping film 223 (see FIG. 4E) may be additionally formed on an upper portion of the metal film 221 before the heat treatment to help reduce and/or prevent oxidization of the metal film 221 during the heat treatment. The metal film 221 and the capping film 223 may be formed using a method, such as, e.g., CVD, PVD, or ALD, which are well known in the art of the invention.

According to another embodiment of the invention, to form the bit-line 225, the silicide film may be formed in an exposed region of the pillar-shaped active region 210 by, e.g., deposition of the metal film 221 at a high temperature, e.g., a temperature of about 600° C. to about 850° C., i.e., a temperature range at which silicidation generally occurs during formation of the metal film 221. In such embodiments, the capping film 223 may not be formed.

Figure 4F:
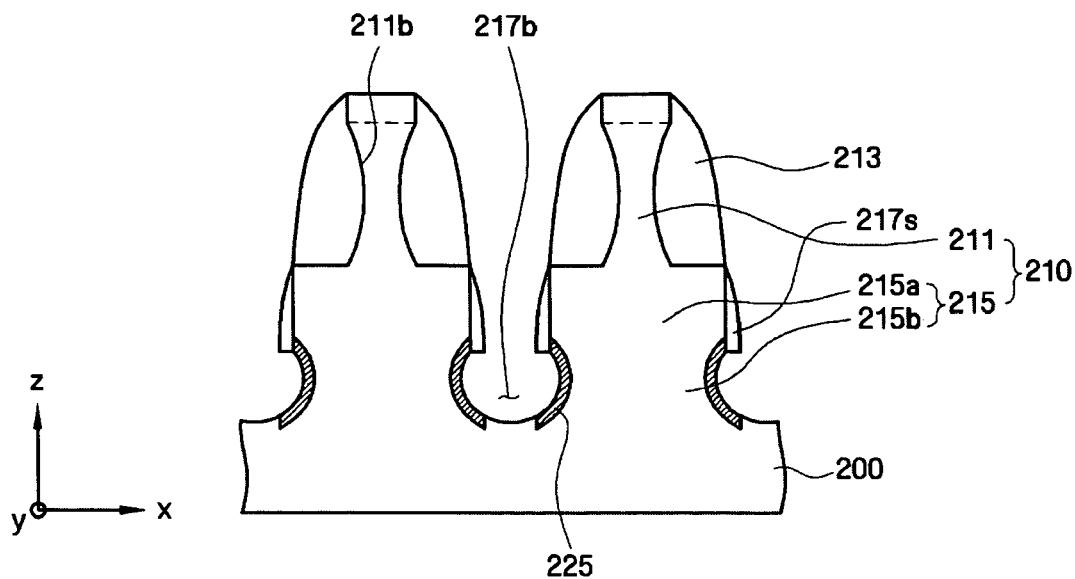

Subsequently, as shown in FIG. 4F, the metal film 221 that did not react to form the silicide layer of the bit-line 225, the capping film 223 and the blocking film 220 may be removed, leaving only the formed bit-line 225.

The process for removing the metal film 221, the capping film 223 and the blocking film 220 may be, e.g., an etching method with a different etching selectivity than that of the bit-line 225 and the semiconductor substrate 200 of the previously formed silicide film. For example, a wet etching method, such as, e.g., a phosphoric-acetic-nitric (PAN) etch using an $H_2SO_4$-based solution may be employed.

Figure 4G:
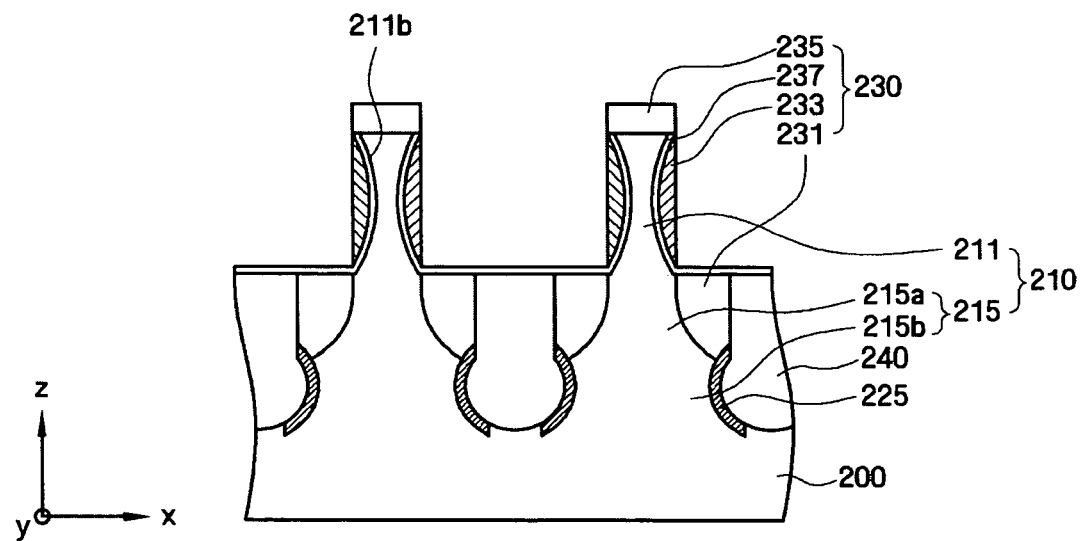

Next, as shown in FIG. 4G, formation of a transistor may be completed within the pillar-shaped active region 210.

More particularly, the element isolation region 240 may be formed by filling the upper trench portion 217a and the lower trench portion 217b between the pillar-shaped active regions 210 with an insulating film, and the spacer 213 (in FIG. 4) surrounding the pillar-shaped active region 211 may be removed. The gate insulating film 237 and the gate electrode 233 may then be sequentially formed on the sidewall 211b of the pillar-shaped active region 210. The gate insulating film 237 and gate electrode 233 may be formed by conformally depositing each raw material, and then etching them.

The source region 235 may then be formed on the upper end 211a of the pillar-shaped active region 210 by implanting impurities, and a drain region 231 may be formed in the semiconductor substrate 200.

Embodiments of the invention enable all the processes for forming a transistor including forming a gate electrode and source/drain regions to be performed after forming the bit-line. However, embodiments of the invention are not limited to such an approach, and in some embodiments, the processes may be performed during a predetermined process before forming the bit-line.

For example, in some embodiments of the invention, a gate electrode may be formed during a predetermined step before the bit-line is formed, and source/drain regions may be formed during a predetermined step after forming the bit-line. In some other embodiments, a gate electrode may be formed at a predetermined step after forming the bit-line, and source/drain regions may be formed at a predetermined step before forming the bit-line.

As described above, a gate electrode and source/drain regions may be formed during an appropriate process before or after forming a bit-line. Accordingly, an order of the processes may be varied, and such variation is within the scope of the invention.

In some embodiments, the semiconductor device shown in FIG. 3 may then be completed by forming a word-line 250 connecting the gate electrodes 233 to each other. The word-line 250 may be made of a metal such as, e.g., tungsten.

After forming the word-line 250, impurities may be additionally implanted to adjust condensation and resistance of an impurity region before a contact forming process is performed.

A semiconductor device realized according to one or more aspects of the invention may involve, as would be known to those skilled in the art, e.g., forming capacitors connected with each transistor, forming wires used to input or output electrical signals to/from each of the transistors, forming of a passivation layer on the substrate, and packaging of the substrate.

As described above, according to aspects of the invention, because a transistor may be formed in a pillar-shaped active region and a bit-line may be formed in a semiconductor substrate, it is possible to manufacture a semiconductor device having improved electrical insulation between cells despite employing reduced design rules.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a semiconductor substrate including pillar-shaped active regions thereon;
a plurality of transistors each having a source region at an upper end of the respective pillar-shaped active region, a drain region in the respective pillar-shaped active region so as to be spaced from the source region, and a gate electrode formed on a gate insulating film on a sidewall of the upper end of the respective pillar-shaped active region between the source region and the drain region; and
bit-lines on sidewalls of lower ends of the pillar-shaped active regions, the bit lines being respectively connected with the respective drain region and spaced from the respective gate electrode, the sidewalls of the lower ends of the pillar-shaped active regions being curved and/or rounded,
wherein the bit lines have a curved and/or rounded cross-sectional shape.

2. The semiconductor device as claimed in claim 1, wherein the lower end of the pillar-shaped active region includes an upper portion and a lower portion, wherein the drain region is formed in the upper portion of the lower end of the pillar-shaped active region and the sidewall where the respective bit-line is formed is in the lower portion of the lower end of the pillar-shaped active region.

3. The semiconductor device as claimed in claim 2, wherein the upper portion of the lower end of the pillar-shaped active region is wider than the lower portion of the lower end of the pillar-shaped active region.

4. The semiconductor device as claimed in claim 1, wherein the sidewall of the upper end of the pillar-shaped active region on which the gate insulating layer and the gate electrode are formed includes a recessed portion.

5. The semiconductor device as claimed in claim 1, wherein the gate electrode includes at least one of TiN, TaN, WN and WCN.

6. The semiconductor device as claimed in claim 5, wherein the gate electrode is connected with a word-line including a metal.

7. The semiconductor device as claimed in claim 1, wherein the bit-line is a silicide film.

8. The semiconductor device as claimed in claim 7, wherein the silicide film is a metallic silicide film including at least one of Co, Ni, Mo, Ta, Zr, W, and Ti.

9. A semiconductor device, comprising:
a semiconductor substrate including a pillar-shaped active region thereon;
a transistor including a source region at an upper end of the pillar-shaped active region, a drain region in the pillar-shaped active region that is spaced from the source region, and a gate electrode on a gate insulating film on a sidewall of the upper end of the pillar-shaped active region between the source region and the drain region; and a bit-line on a sidewall of a lower end of the pillar-shaped active region, the bit line being connected with the drain region and spaced from the gate electrode, wherein:

the lower end of the pillar-shaped active region includes an upper portion and a lower portion, the drain region is in the upper portion of the lower end of the pillar-shaped active region, the sidewall corresponding to the bit-line is in the lower portion of the lower end of the pillar-shaped active region, and the upper portion of the lower end of the pillar-shaped active region is wider than the lower portion of the lower end of the pillar-shaped active region.

* * * * *